United States Patent
Mimlitch, III et al.

(10) Patent No.: US 7,201,279 B1
(45) Date of Patent: Apr. 10, 2007

(54) SLIDING RACK-MOUNTABLE SHELF FOR RACK-MOUNTABLE COMPONENTS

(75) Inventors: Robert H Mimlitch, III, Rowlett, TX (US); David Anthony Norman, Greenville, TX (US)

(73) Assignee: Innovation First, Inc., Greenville, TX (US)

( * ) Notice: Subject to any disclaimer, the term of this patent is extended or adjusted under 35 U.S.C. 154(b) by 71 days.

(21) Appl. No.: 10/622,402

(22) Filed: Jul. 18, 2003

Related U.S. Application Data

(60) Provisional application No. 60/396,759, filed on Jul. 18, 2002.

(51) Int. Cl.
*A47F 7/00* (2006.01)
*A47F 5/00* (2006.01)

(52) U.S. Cl. ................ 211/26; 211/175; 211/190

(58) Field of Classification Search ............... 211/26, 211/126.15, 134, 175, 187, 190, 189; 361/826, 361/725, 727; 312/223.1, 334.4, 334.5, 334.7, 312/334.8, 265.4
See application file for complete search history.

(56) References Cited

U.S. PATENT DOCUMENTS

| | | | | |
|---|---|---|---|---|
| 5,215,362 A * | 6/1993 | Zoellner | ............... | 312/246 |
| 5,340,340 A | 8/1994 | Hastings et al. | | |
| 5,351,176 A | 9/1994 | Smith Stephen W. et al. | | |
| 5,542,549 A | 8/1996 | Siemon et al. | | |
| 5,873,641 A * | 2/1999 | Spinelli | ............... | 312/114 |
| 5,941,621 A | 8/1999 | Boulay et al. | | |
| 6,021,909 A | 2/2000 | Tang et al. | | |
| 6,142,590 A * | 11/2000 | Harwell | ............... | 312/223.1 |
| 6,170,784 B1 | 1/2001 | MacDonald et al. | | |
| 6,201,690 B1 * | 3/2001 | Moore et al. | ............... | 361/683 |
| 6,220,456 B1 | 4/2001 | Jensen et al. | | |
| 6,227,630 B1 * | 5/2001 | Brown et al. | ............... | 312/223.2 |
| 6,254,041 B1 | 7/2001 | Dufourg | | |
| 6,349,837 B1 | 2/2002 | Serban | | |
| 6,370,022 B1 | 4/2002 | Hooper et al. | | |
| 6,431,668 B1 * | 8/2002 | Reddicliffe | ............... | 312/334.5 |
| 6,442,020 B1 * | 8/2002 | Liu et al. | ............... | 361/683 |
| 6,556,432 B2 * | 4/2003 | Chen et al. | ............... | 361/685 |
| 6,644,481 B2 * | 11/2003 | Dean et al. | ............... | 211/26 |
| 6,655,534 B2 | 12/2003 | Williams et al. | | |
| 6,719,149 B2 * | 4/2004 | Tomino | ............... | 211/26 |
| 6,739,682 B2 * | 5/2004 | Shih | ............... | 312/334.4 |
| 6,974,037 B2 * | 12/2005 | Haney | ............... | 211/26 |
| 6,988,626 B2 * | 1/2006 | Varghese et al. | ............... | 211/26 |
| 2001/0040142 A1 | 11/2001 | Haney | | |
| 2002/0043508 A1 | 4/2002 | Lewis | | |
| 2003/0019822 A1 * | 1/2003 | Liu | ............... | 211/26 |
| 2003/0019823 A1 | 1/2003 | Corbett, Jr. et al. | | |
| 2003/0205539 A1 * | 11/2003 | Lauchner et al. | ............... | 211/26 |

* cited by examiner

OTHER PUBLICATIONS

Chatworth Products, Inc., www.chatsworth.com, Dell Rack-Mount Server Solutions, Form No. MKT - 600020-061-CH, Dec. 2001 (2 pages).

*Primary Examiner*—Jennifer E. Novosad
(74) *Attorney, Agent, or Firm*—Fish & Richardson P.C.

(57) ABSTRACT

A sliding support shelf supports equipment within a rack system regardless of its design. The base of the support shelf includes a surface capable of supporting the equipment reducing unintended movement of the equipment, providing security of the supported equipment, and enhancing ventilation of the equipment. A slide is associated with the base to allow the base to move with respect to the rack. The slide lacks ball bearings, but provides smooth movement of the base without requiring direct attachment to the equipment. Cable management arms are integral to the base to manage the various cables and the like associated with the equipment. The method of the present invention comprises steps of use of the support shelf with various designs of racks and types and dimensions of equipment to be supported.

19 Claims, 11 Drawing Sheets

Step 10 – select design of rack system

Step 20 - selection of orientation of the base to accommodate width of the load to be supported Step 30 - if a two-post design is selected in Step 10 above, then utilize a conversion bracket to mount the base in either a centered or flushed position with respect to the rack system Step 40 - placing a load on the base to be Step 50 – optionally, coupling cables associated with the load to be supported to means for cable management

SLIDING RACK-MOUNTABLE SHELF FOR RACK-MOUNTABLE COMPONENTS

CROSS-REFERENCE TO RELATED APPLICATIONS

This application is related to co-pending provisional application Ser. No. 60/396,759, filed Jul. 18, 2002, which is incorporated herein by reference.

TECHNICAL FIELD

The present invention relates to support racks, and more particularly to a sliding apparatus and method for supporting equipment, such as electronic equipment.

BACKGROUND

The use of traditional fixed shelves to support electronic components or equipment not designed or modified for coupling with equipment racks has traditionally been problematic from an equipment configuration and maintenance standpoint. Such electronic equipment includes traditional personal computers or other standalone devices that are not configured to be coupled to rack slides as understood in the art. In the case of configuring electronic equipment not designed or modified for coupling to equipment racks, fixed shelving does not provide installation convenience for a number of reasons. For example, installing moderately heavy equipment (e.g., between 20 and 40 pounds) is difficult as it can be awkward to lift or place the equipment into a rack having a fixed shelf. To conserve rack space, which is premium, shelves are generally spaced as closely together as possible. Existing fixed shelves also lack cable management and fail to provide any means to couple equipment to the shelf.

Existing sliding shelf options also suffer from several drawbacks. For example, such options generally fail to extend a sufficient length to allow access to the electronic components to be coupled thereon. Ideally, a shelf should extend several inches past the depth of the component to be supported so that access to the rear of the component and associated cables is provided. Additionally, the few option that provide extended sliding length are cost prohibitive for mounting the instant electronic equipment. It is not practical to expend a multiple of the costs associated with the equipment to be supported within the rack on the sliding shelf itself.

As a result, there remains a need for a rack mountable shelf capable of coupling to a two-post or four-post rack and supporting computers or other electronic equipment not adapted or configured to be coupled to traditional rack mountable sliding shelves.

SUMMARY

The support shelf of the present invention includes a base portion having a support surface adapted to support electronic equipment, such as a personal computer. The base portion includes an integral handle for moving the base portion relative to slide sections coupled to the base portion. Optional slots or holes are provided on the support surface to serve several functions. For example, such openings provide weight reduction, versatility of shelf orientation, component stability/security and increased ventilation.

The support shelf of the present invention provides a number advantages over fixed shelf, and even existing sliding shelf, options, including versatility (the shelf can be flipped along a central axis to provide optimum spacing options); universality (the shelf can be used with both two-post and four-post rack systems); low cost (the shelf includes non-ball bearing slides), cable management (movable arms allow cable movement with shelf movement), and ease of maintenance.

The details of one or more embodiments of the present invention are set forth in the accompanying drawings and the description below. Other features, objects, and advantages of the invention will be apparent from the description and drawings, and from the claims.

DESCRIPTION OF DRAWINGS

FIG. 12 is a flowchart illustrating the steps of the present invention method of utilizing a support shelf of the present invention.

Like reference symbols in the various drawings indicate like elements.

DETAILED DESCRIPTION

Various embodiments of the principles of the present invention are shown in FIGS. 1–12. The present invention comprises a sliding support shelf, and associated method for use of same, for electronic and related components to be supported in either two-post or four-post rack systems of various configurations. The sliding support shelf of the present invention is designed to provide support and security for components not adapted or configured for use with rack systems, such as desktop computers, tower computers, tape drives, hubs, switches and the like.

Figure 1:
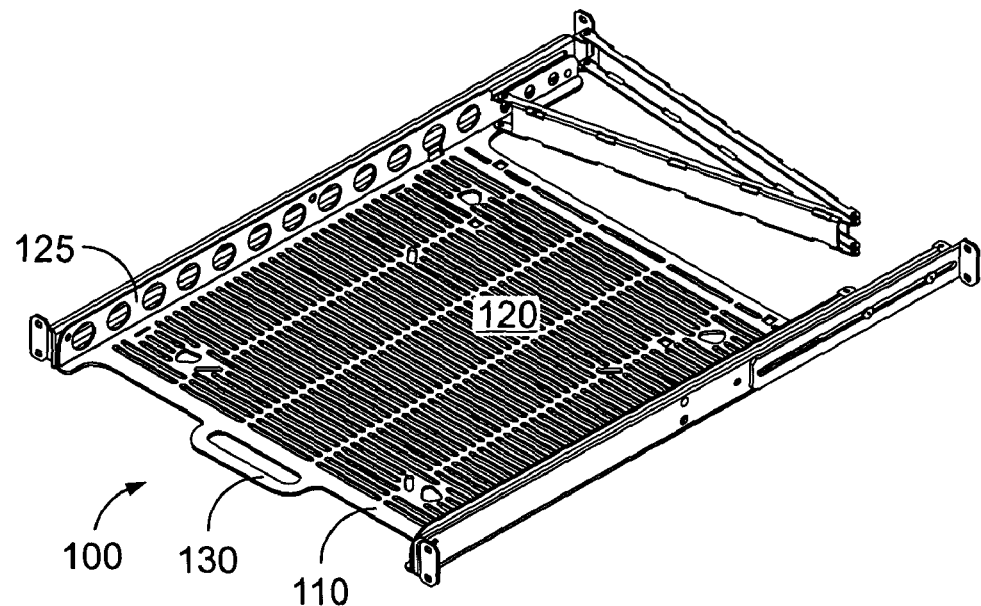
FIG. 1 is a perspective view of an embodiment of the sliding support shelf of the present invention.

As illustrated in FIG. 1, the support shelf 100 of the present invention comprises a base 110 having a support surface 120 adapted to support electronic equipment (not shown), such as a personal computer, and inner slide rails 125 on either side of the base 110. The base 110 may include an optional integral handle 130 for moving the base 110 relative to the rack.

Figure 2:
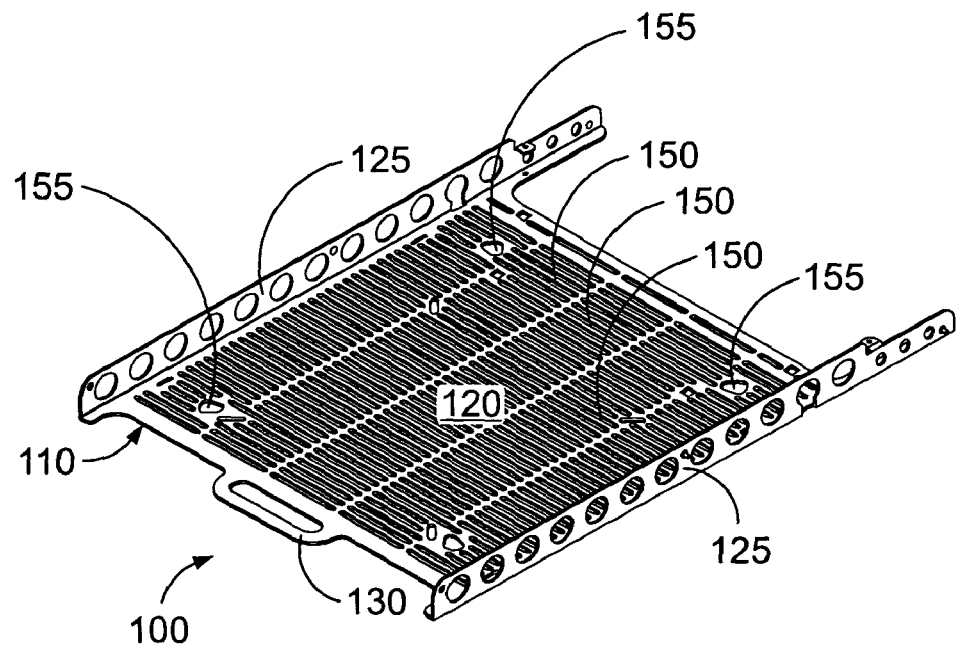
FIG. 2 is a perspective view of the base of an embodiment of the sliding support shelf of the present invention including openings.

As illustrated in FIG. 2, one or more openings 150, such as slots or holes, may be provided on the support surface 120 to serve one or more of several functions. First, the openings 150 reduce the overall weight of the shelf 100. Second, the openings 150 may be orientated in a right-to-left or left-to-right direction, which increases the front-to-back friction between the shelf and the "feet" of the equipment supported thereon. The orientation of the openings 150 further serves to reduce the likelihood of equipment inadvertently moving or sliding around on the shelf 100. Additionally, the openings 150 may be oriented in a front-to-back direction to allow equipment to be coupled to the shelf 100 via straps or other coupling mechanisms. The coupling of equipment to the shelf 100 may be desirable in regions prone to structural shifting and the like. Additionally, holes 155 may be provided within the base 110 to correspond to the location and size of feet associated with specific equipment models, if desired, to further limit lateral movement of equipment supported by the support shelf 100. The openings 150 may be positioned conceivably anywhere on the base 110 to provide for coupling locations of the computers or electronic components. Pre-determined patterns may be used to correspond with the dimensions of various equipment components from different manufacturers.

The openings 150, with the optional assistance of tabs, straps and the like, further serve to prevent the electronic component from moving after coupling to the base 110. Anti-slip pads (not shown) also may be placed on the base 110 to increase friction between the support surface 120 and the electronic component coupled thereto. Ventilation is accomplished, in part, via the openings 150 within the support surface 120 of the base 110.

Figure 3:
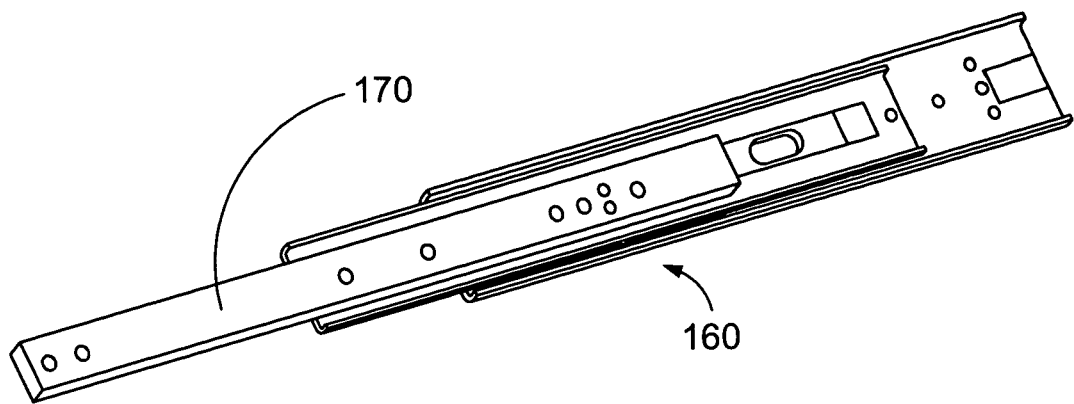
FIG. 3 is a three-piece slide representative of existing prior art sliding shelves.

Now referring to FIG. 3, there is shown a three-piece slide 160 representative of existing prior art slides for use with shelves and the like. In typical prior art sliding shelf systems, the slide 160 is a component purchased separately and coupled to the shelf to provide the shelf the ability to slide with respect to the rack. Such prior art slides use ball bearings to ensure smooth movement of the shelf with respect to the rack. Installation of a prior art slide requires that an inner slide section 170 be attached to the outside of the equipment component to be supported, and additional brackets (not shown) be attached to the outer section of the rack. Such a prior art slide 170 adds substantial cost to sliding shelf systems; employs ball-bearing slides that are designed for significantly more sliding cycles (in-and-out) than is needed for electronics racking applications; and requires production labor and cost for screws, rivets, or other mechanical attachment.

Figure 4:
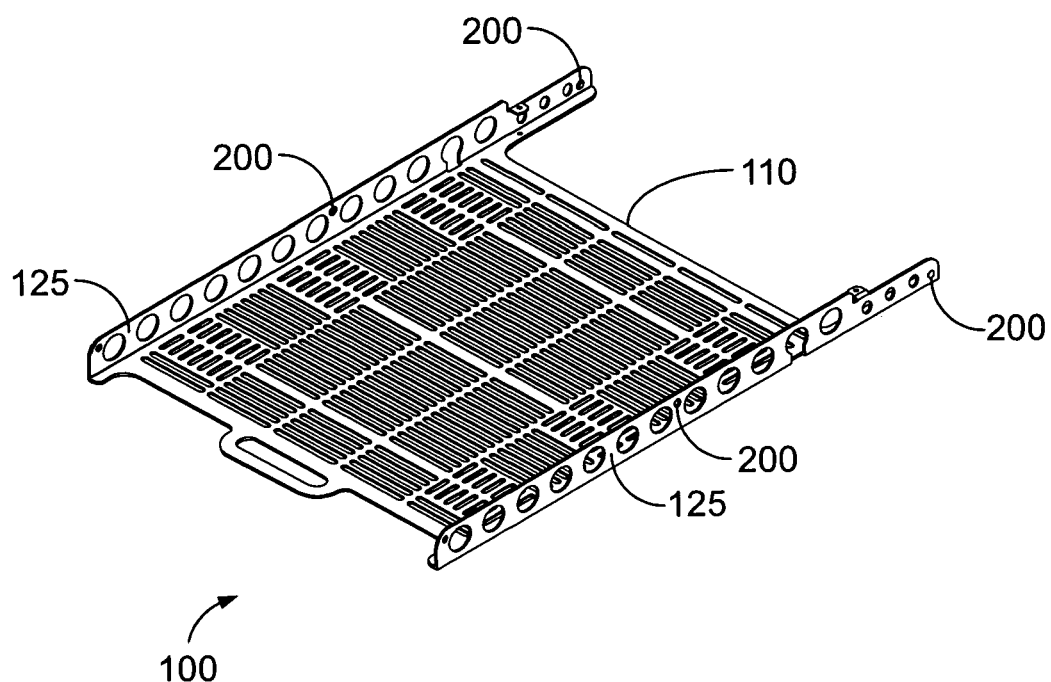
FIG. 4 is a perspective view of the base of an embodiment of the sliding support shelf of the present invention including strap slots.
Figure 5:
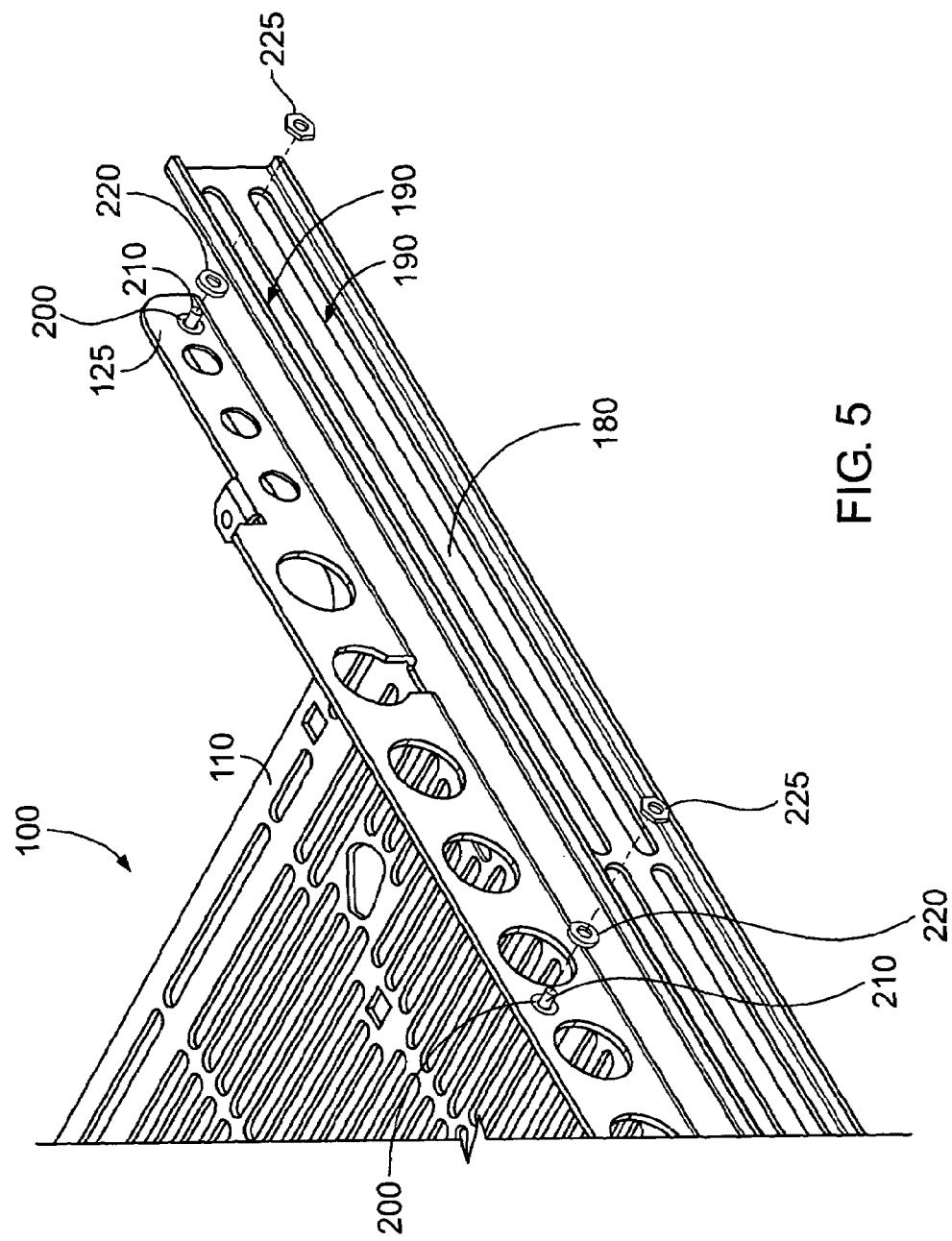
FIG. 5 is an exploded view of an embodiment of the sliding support shelf of the present invention, illustrating the attachment of the slides to the base.

Now referring to FIGS. 4 and 5, a center slide member 180 of the present invention support shelf 100 includes slide slots 190 along its length. Two of the slide slots 190 are used in coupling the center slide member 180 to the inner slide rails 125 while allowing the center slide member 180 to translate aft with respect to the base 110. The inner slide rails 125 are also provided with one or more, and preferably two, holes 200, one preferably centrally located along the length of the inner slide rails 125, and another preferably located near the rear of the base 110. The holes 200 allow coupling of the inner slide rails 125 to the center slide member 180 via the slide slots 190, or coupling to rack components, or even to the rack system directly, via suitable fasteners. In a preferred embodiment, the suitable fasteners include a screw 210, a spacer washer 220, and a shoulder washer 225. The spacer washer 220 and the shoulder washer 225 are preferably made of a low friction material (e.g., brass). The spacer washer 220 is used between the center slide member 180 and the inner slide rails 125 to provide sufficient spacing to allow the center slide member 180 to move with respect to the inner slide rails 125 of the base 110. The shoulder washer 225, when threaded to mate with the screw 210, slides within the slot 190, and couples the center slide member 180 to the inner slide member 125.

Figure 6A:
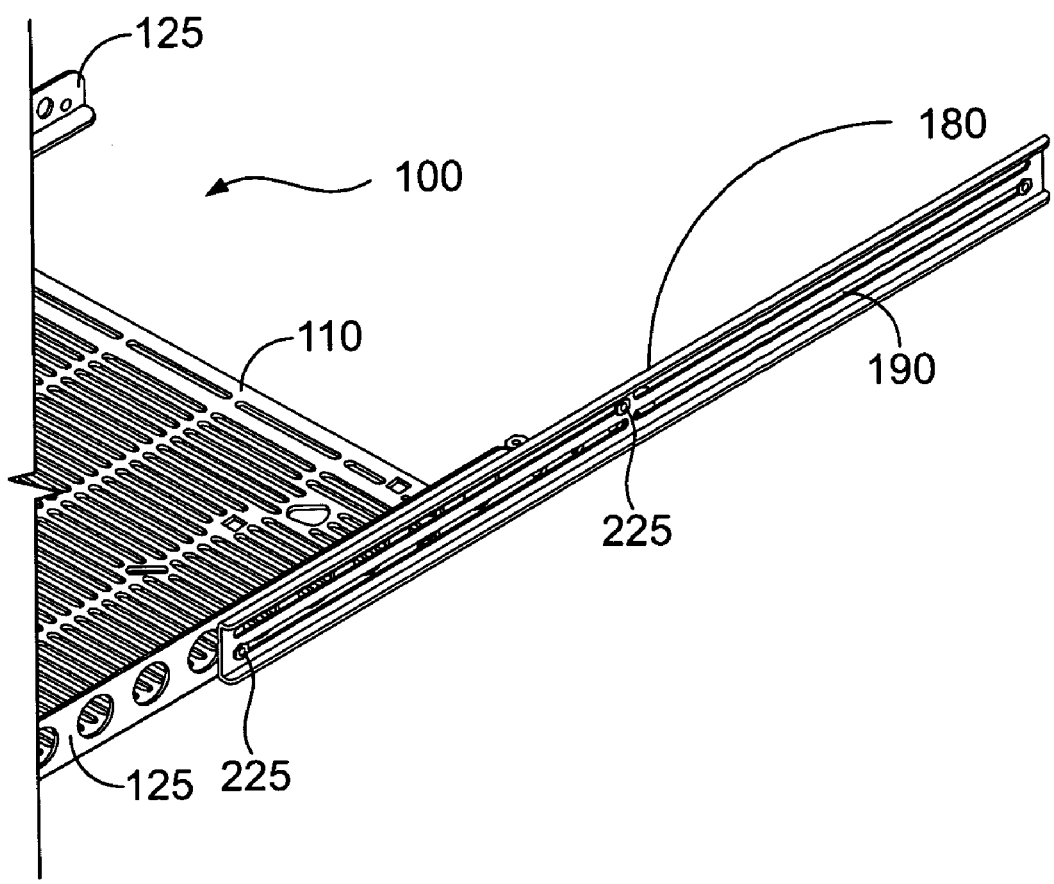
FIG. 6A is a perspective view of an embodiment of the sliding support shelf of the present invention illustrating the shelf in an extended position.
Figure 6B:
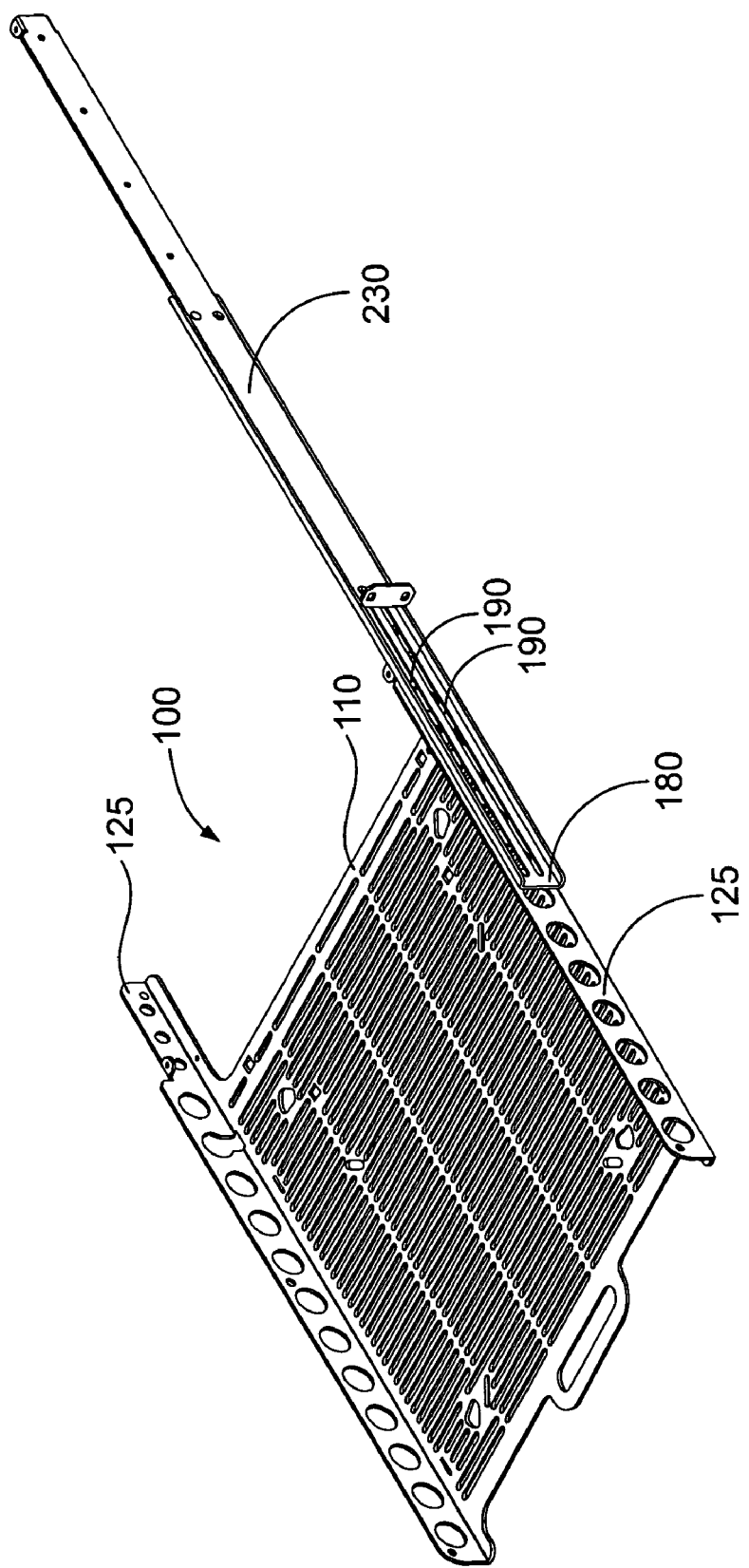
FIG. 6B is a perspective view of an embodiment of the sliding support shelf of the present invention illustrating the shelf in a fully extended position.

As illustrated in FIGS. 6A and 6B, the center slide member 180 is preferably associated with an outer slide member 230. The outer slide member 230 is coupled to the center slide member 180 through remaining slide slots 190 to provide additional extension of the base 110 of the support shelf 100 with respect to the rack. The outer slide member 230 is coupled to the center slide member 180 via the same suitable fasteners, (e.g., screw 210, spacer washer 220) (See FIG. 5), and shoulder washer 225. FIG. 6A illustrates the center slide member 180 fully extended with respect to the base 110 of the support shelf 100. FIG. 6B illustrates the outer slide member 230 also fully extended to provide additional extension of the base 110 of the support shelf 100 with respect to the rack. Accordingly, not only does the center slide member 180 function to extend and retract the support shelf 100, but the outer slide member 230 provides additional extension or retraction depth, providing additional access to the component and associated cables for ease of use/maintenance.

Figure 7:
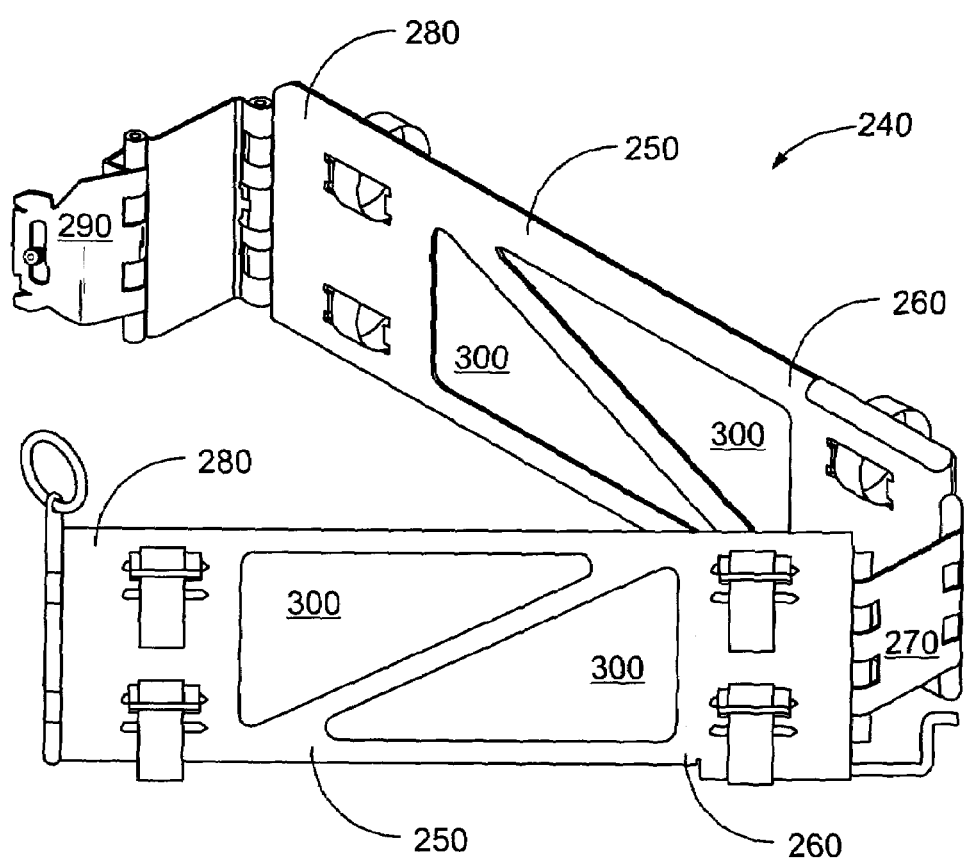
FIG. 7 is a perspective view of an embodiment of the cable management arm of the present invention.
Figure 8:
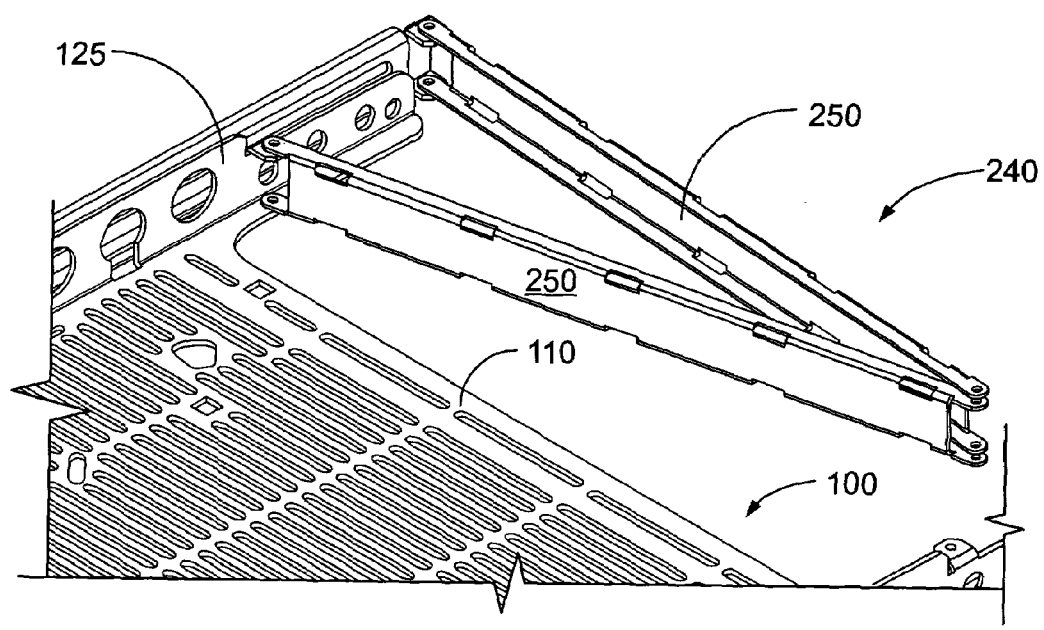
FIG. 8 is a perspective view illustrating attachment of the cable management arm to an embodiment of the present invention sliding support shelf.

Now turning to FIGS. 7 and 8, a cable management device 240 is illustrated. In one embodiment, the cable management device 240 comprises two cable management arms 250 of identical design coupled at their proximal ends 260 by an elbow pivot point 270. The distal ends 280 of the cable management arms 250 are coupled to either the base 110 of the support shelf 100 via arm attachment flanges 290 or other suitable fasteners, or directly to the rack. Thus, when the supports shelf 110 is extended, the cable management arms 250 pivot about the elbow pivot point 270, also extending in relation to the position of the support shelf 100. Preferably, the shape of the cable management arms 250 is a C-channel design. Optionally, the cable management arms 250 may be provided with one of more slots 300 through which cable ties, Velcro™ ties, or the like may be threaded to constrain the cables associated with the equipment components being supported by the support shelf 100.

Figure 9:
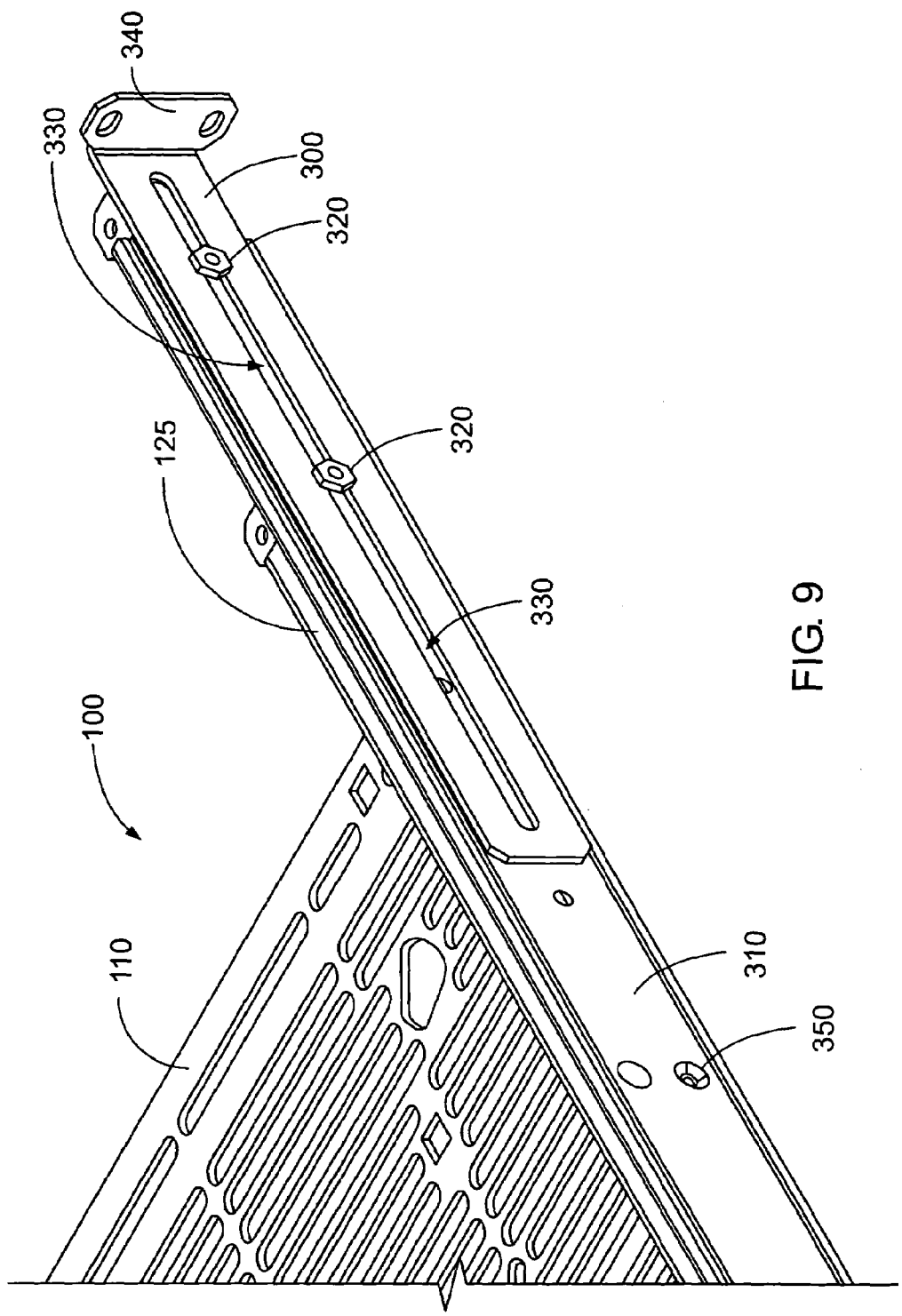
FIG. 9 is a perspective view illustrating the use of a rear slider to allow the sliding support rack of the present invention to be used with racks of varying depths.

Referring now to FIGS. 8 and 9, deflection of the cable management arms 250 via the weight of the cables may be addressed by skewing the attachment angle of one or both cable management arms 250, such that a pivot point formed between the cable management arms 250 is elevated. When the orientation of the support shelf 100 is reversed (i.e., is in an upside-down configuration), the cable management arms 250 are attached on an opposing side from the right-side-up configuration, resulting in the same elevation of the pivot point formed between the cable management arms 250 and the attachment point to the base 110 of the support shelf 100.

To accommodate attachment of the support shelf 100 of the present invention to racks of various depths, a rear attachment slider 300 coupled to a rack attachment bracket 310 is provided. As illustrated in FIG. 9, the rear attachment slider 300 slides via suitable fasteners 320 (e.g., shoulder nuts) coupled to the inner slide rails 125 via sliding slot 330. The rear attachment slider 300 includes a rear attachment flange 340, that can be adjusted continuously by moving the rear attachment slider 300 in the sliding slot 330, moving the fasteners 320 to a different series of connection points 350 provided on the rack attachment bracket 310, and/or inverting the direction of the rear attachment slider 300.

Figure 10A:
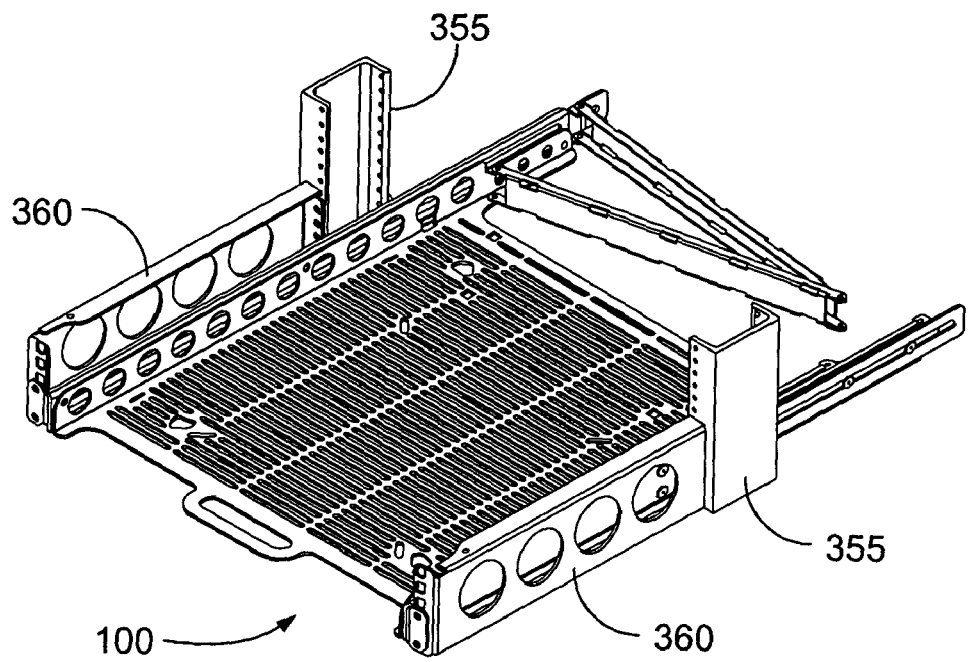
FIG. 10A is a perspective of an embodiment of the sliding support shelf of the present invention as coupled to a two-post rack design (centered position)
Figure 10B:
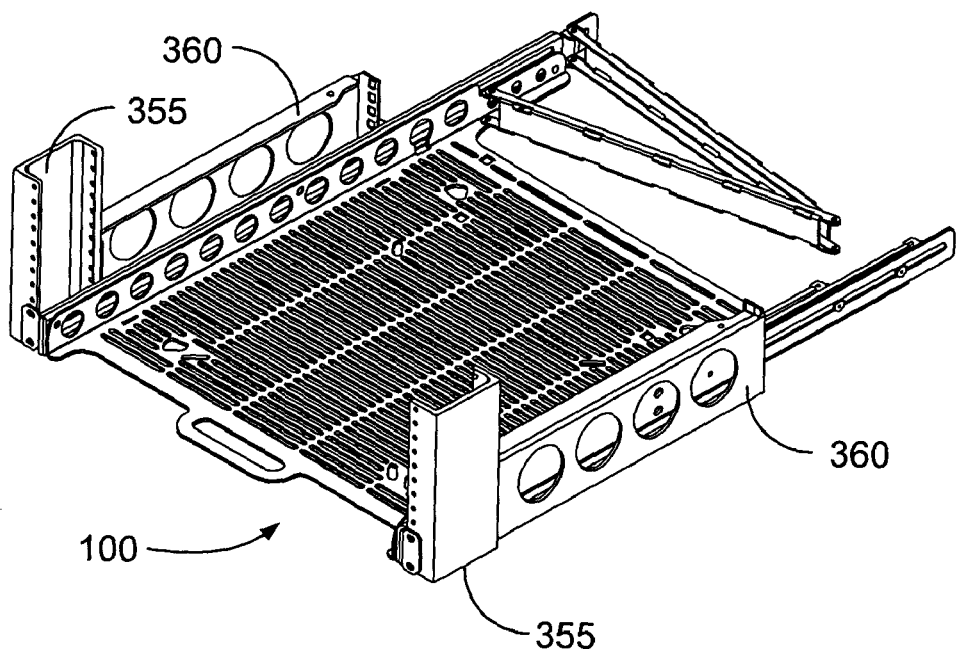
FIG. 10B is a perspective of an embodiment of the sliding support shelf of the present invention as coupled to a two-post rack design (flush position)

Referring now to FIGS. 10A and 10B, there is shown a support shelf 100 of the present invention coupled to a two-post rack system in a centered and flush configuration, respectively. In FIG. 10A, the support shelf 100 is coupled to a two-post rack system 355 utilizing a conversion bracket 360. Using the conversion bracket 360, the rack system 355 is, in effect, extended forward such that the support shelf 100 is centered, when mounted, on the rack system 355. In FIG. 10B, the conversion bracket 360 is used to extend the rack system 355 backwards, thereby allowing the support shelf 100 to be mounted in a position flush with the front of the rack system 355.

Figure 11:
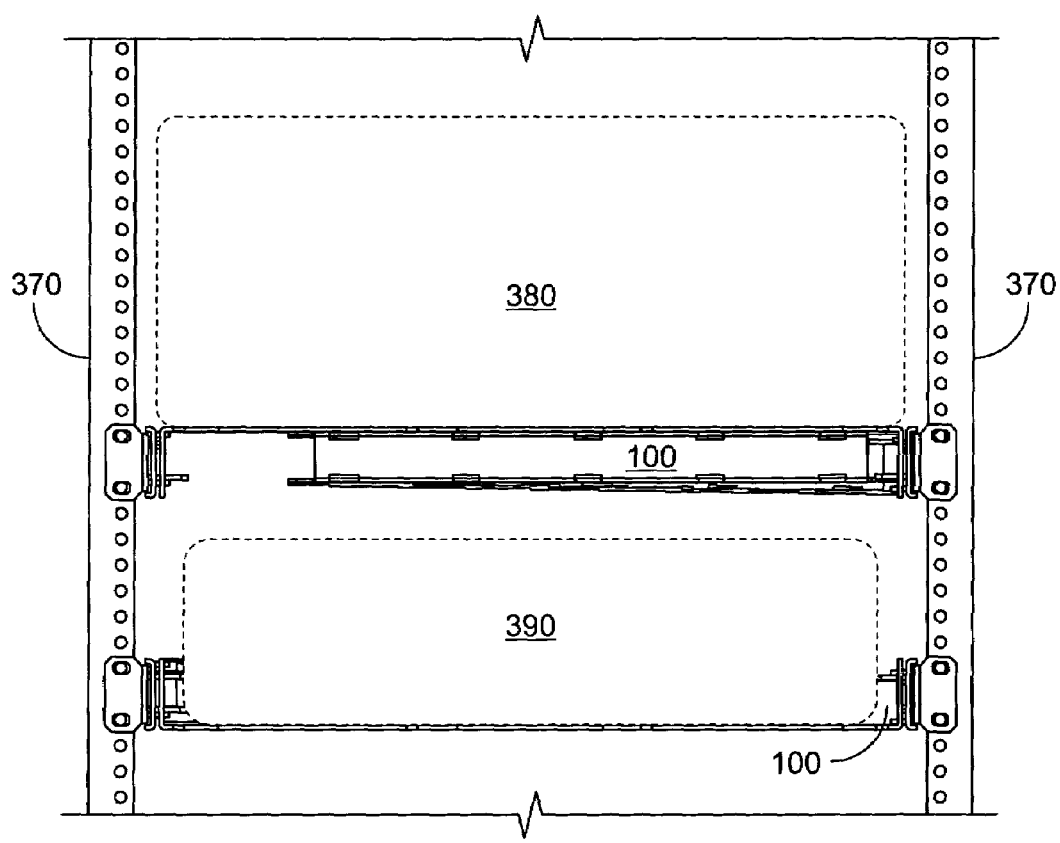
FIG. 11 is a perspective of an embodiment of the sliding support shelf of the present invention as coupled to a four-post rack design, illustrating installation of a relatively narrow component (upper) and a relatively wide component (lower)

In FIG. 11, there is shown two support shelves 100 attached to a four-post rack system 370. Component A 380 is supported by the upper support shelf 100, and Component B 390 is supported by the lower support shelf 100. Component A 380 is relatively wide when compared with the width of Component B 390. Accordingly, the upper support shelf 100 is installed to the rack system 370 in an inverted orientation to accommodate the larger width of Component A 380. Although right-side up orientation is preferred (to conserve rack space), the orientation feature of the present invention allows the support shelf 100 to accommodate varying widths of components to be supported.

Now turning to FIG. 12, the present invention method of using the support shelf 100 of the present invention includes the steps of: Step 10—selecting a two-post or four-post rack system (a two-post system modified to replicate a four-post system may also be selected) upon which to support a load, like an electronic component; Step 20—select the proper orientation (up-side down or right-side up) to accommodate the width of the component to be supported by the support shelf 100; Step 30—if a two-post rack system is selected, utilizing a conversion bracket 360 to mount the support shelf 100 in either a centered or flushed position; Step 40—once installed, placing a load, such as a computer and the like, to the base 110 of the support shelf 100 to be supported thereon, and Step 50—optionally, coupling cables and the like associated with the component to be supported to the cable management arms 250 for management thereof.

It is to be appreciated that the support shelf of the present invention may couple to substantially any existing two-post or four-post rack system and support loads accordingly. It is to be further appreciated that the support shelf of the present invention provides numerous configurations for supporting a variety of loads, depending on the requirements of the user and dimensions of the loads to be supported. The present invention method may be used to accommodate use of the present invention support shelf with all the various rack systems and configurations thereof.

A number of embodiments of the invention have been described. Nevertheless, it will be understood that various modifications may be made without departing from the spirit and scope of the invention. Accordingly, other embodiments are within the scope of the following claims.

What is claimed is:

1. A support shelf for supporting a load in a rack system of either a two-post or four-post design, the support shelf comprising:
   a base having a support surface capable of supporting a load; and
   a slide member coupled to the base and operable to translate relative to the base, wherein the slide member includes a first slot for receiving a first fastener that couples the slide member to the base and a second slot for receiving a second fastener that couples the slide member to the base, the first slot and the second slot facilitating translation of the slide member relative to the base and the second fastener spaced apart from the first fastener in a direction of the relative translation.

2. The support shelf of claim 1, wherein the base is adapted to support electrical equipment selected from the group consisting of: desktop computers, tower computers, tape drives, hubs, and switches.

3. The support shelf of claim 1, wherein the slide member includes means for providing smooth movement of the base with respect to a rack system without a need for ball bearings.

4. The support shelf of claim 1, wherein the base includes means to accommodate loads of varying width.

5. The support shelf of claim 4, wherein the means to accommodate includes a varied orientation of the base with respect to the rack system.

6. The support shelf of claim 1 wherein the slide member comprises a center slide member, the support shelf further comprising an outer slide member coupled to the center slide member and operable to translate relative to the center slide member.

7. The support shelf of claim 6 wherein the center slide member further includes a third slot for receiving a third fastener that couples the center slide member to the outer slide member and a fourth slot for receiving a fourth fastener that couples the center slide member to the outer slide member, the third slot and the fourth slot facilitating translation of the center slide member relative to the outer slide member and the fourth fastener spaced apart from the third fastener in a direction of the relative translation.

8. The support shelf of claim 7 wherein the first and third slots are parallel and the second and fourth slots are parallel.

9. The support shelf of claim 8 wherein the first slot and one of the second slot or the fourth slot are substantially collinear and the third slot and one of the second slot or the fourth slot are substantially collinear.

10. The support shelf of claim 7 wherein the outer slide member comprises a flange for attaching the outer slide member to a rack, and wherein the center slide provides an extension of the base with respect to the rack, and wherein the outer slide member provides an additional extension of the base with respect to the rack.

11. The support shelf of claim 7 further comprising an attachment slider adapted to attach to the outer slide member and to enable attachment of the support shelf to racks of a plurality of different dimensions in a direction of the relative translation, the attachment slider having an attachment flange for attaching the attachment slider to a rack.

12. The support shelf of claim 11 wherein the attachment slider includes a slot for enabling adjustable attachment of the support shelf to facilitate attachment to racks having different dimensions in the direction of the relative translation.

13. The support shelf of claim 6 wherein a plurality of slots facilitates translation of the center slide member relative to the base and translation of the outer slide member relative to the center slide member, with two of the slots used for-coupling the center slide member to the base and being one of substantially parallel or substantially collinear, and with two of the slots used for coupling the outer slide member to the center slide member and being one of substantially parallel or substantially collinear.

14. The support shelf of claim 1 further comprising a plurality of cable management arms each having a proximal end and a distal end, the cable management arms pivotably coupled at the proximal ends, the distal end of a first one of the cable management arms coupled to a rack system to substantially prevent translational movement of the distal end relative to the rack system, and the distal end of a second one of the cable management arms coupled to the base to substantially prevent translational movement of the distal end relative to the base.

15. A support shelf for supporting a load in a rack system of either a two-post or four-post design, the support shelf comprising:
   a base having a support surface capable of supporting a load; and
   slide member coupled to the base and operable to translate relative to the base, wherein the base further comprises a support rail on a lateral side of the support surface, the support rail adapted to couple the base to the slide member, wherein the support rail includes a first aperture located centrally along a length of the base and a second aperture located near a rear of the base, each of the first aperture and the second aperture adapted for coupling the base to the slide member using a first fastener and a second fastener, respectively.

16. The support shelf of claim 15 wherein the slide member includes:
   a first slot adapted to slidably couple the slide member to the first aperture using the first fastener; and
   a second slot adapted to slidably couple the slide member to the second aperture using the second fastener.

17. A slidable support for a support shelf in a computer rack system the slidable support comprising:
   a center slide member adapted for coupling to a base of a support shelf and operable to translate relative to the base wherein the center slide member includes a first slot adapted to receive a first fastener for coupling the center slide member to a base and a second slot adapted to receive a second fastener for coupling the slide member to the base, the first slot and the second slot facilitating translation of the center slide member relative to the base and the second fastener spaced apart from the first fastener in a direction of the relative translation; and
   an outer slide member adapted for coupling to the center slide member and operable to translate relative to the center slide member.

18. The slidable support of claim 17 wherein the outer slide member provides, relative to an extension provided by the center slide member, additional extension of the base with respect to the rack.

19. A method for supporting a load in a rack system of either a two-post or four-post design, the method comprising:
   slidably coupling a base having a support surface capable of supporting a load to a center slide member, the base coupled to the center slide member using at least one slot for receiving a fastener that couples the center slide member to the base, the at least one slot facilitating translation of the center slide member relative to the base;
   slidably coupling the center slide member to an outer slide member to enable the outer slide member to translate relative to the center slide member, the center slide member coupled to the outer slide member using at least one slot for receiving a fastener that couples the outer slide member to the center slide member, the at least one slot facilitating translation of the outer slide member relative to the center slide member;
   placing an electronic component on the support surface;
   extending the center slide member with respect to the base; and
   extending the outer slide member with respect to the center slide member.

* * * * *